(12) United States Patent
Chan et al.

(10) Patent No.: US 8,148,892 B2
(45) Date of Patent: Apr. 3, 2012

(54) SYSTEM FOR DISPLAYING IMAGES INCLUDING ACTIVE-MATRIX ORGANIC LIGHT EMISSION DISPLAY

(75) Inventors: Chuan-Yi Chan, Taipei (TW); Ping-Lin Liu, Tainan (TW); Du-Zen Peng, Jhubei (TW)

(73) Assignee: Chimei Innolux Corporation, Chu-Nan (TW)

( * ) Notice: Subject to any disclaimer, the term of this patent is extended or adjusted under 35 U.S.C. 154(b) by 328 days.

(21) Appl. No.: 12/150,560

(22) Filed: Apr. 29, 2008

(65) Prior Publication Data

US 2008/0290796 A1 Nov. 27, 2008

(30) Foreign Application Priority Data

May 22, 2007 (TW) ................................ 96118170 A

(51) Int. Cl.
*H01L 51/52* (2006.01)
(52) U.S. Cl. ......................................... 313/504
(58) Field of Classification Search ........................ None
See application file for complete search history.

(56) References Cited

U.S. PATENT DOCUMENTS

| | | | |
|---|---|---|---|
| 4,759,516 A * | 7/1988 | Grose ........................... | 244/130 |
| 6,812,912 B2 * | 11/2004 | Miyajima et al. ............... | 345/92 |
| 7,068,246 B2 * | 6/2006 | Yamazaki et al. ............... | 345/76 |
| 7,173,279 B2 * | 2/2007 | Yamazaki et al. ............... | 257/59 |
| 2003/0025118 A1 | 2/2003 | Yamazaki et al. | |
| 2003/0205708 A1 | 11/2003 | Lee et al. | |
| 2003/0222577 A1 | 12/2003 | Lu | |
| 2004/0232420 A1 | 11/2004 | Lee et al. | |
| 2005/0007494 A1 * | 1/2005 | Yamazaki et al. ............ | 348/552 |
| 2005/0168135 A1 * | 8/2005 | Iga .................................. | 313/500 |
| 2006/0027817 A1 | 2/2006 | Yamazaki et al. | |
| 2008/0157664 A1 * | 7/2008 | Cok .............................. | 313/506 |

\* cited by examiner

*Primary Examiner* — Toan Ton
*Assistant Examiner* — Britt D Hanley
(74) *Attorney, Agent, or Firm* — Liu & Liu

(57) ABSTRACT

A system for displaying images is provided, including an active-matrix organic light emission display. The active-matrix organic light emission display comprises an active-matrix array on a display area of an array substrate, a peripheral circuit on a peripheral area of the array substrate, a reflective layer on the peripheral area of the array substrate, between a light emission plane and the peripheral circuit and covering the peripheral circuit, an organic light emission layer on the active-matrix array and a cover layer over the organic light emission layer, covering the display area and the peripheral area.

20 Claims, 5 Drawing Sheets

SYSTEM FOR DISPLAYING IMAGES INCLUDING ACTIVE-MATRIX ORGANIC LIGHT EMISSION DISPLAY

FIELD OF THE INVENTION

The invention relates to a system for displaying image including an active-matrix organic light emission display, and more particularly to an active-matrix organic light emission display having a light shielding structure at a peripheral circuit area.

DESCRIPTION OF THE RELATED ART

Recently, liquid crystal displays or active-matrix organic light emission displays (AMOLED) have been applied widely to display elements of various products. Displays need a peripheral circuit to be disposed on the panel. For panel designs of active-matrix organic light emission displays, thin film transistors in the peripheral circuit are easily illuminated by external light to produce photoelectric effect. As a result, current leakages occur at the peripheral circuit area of the active-matrix organic light emission displays.

The conventional active-matrix organic light emission display includes a bottom emission AMOLED and a top emission AMOLED. The cross sections of the bottom emission and top emission AMOLEDs are as shown in FIGS. 1 and 2, respectively. Referring to FIG. 1, the bottom emission AMOLED has a display area 102 and a peripheral area 101. An active-matrix array 12 is disposed on the display area 102 of an array substrate 10. A peripheral circuit 14 is disposed on the peripheral area 101 of the array substrate 10. An organic light emission layer 16 is disposed on the active-matrix array 12. In addition, a cathode layer 11 can be disposed on the organic light emission layer 16. A cover glass 18 is disposed over the array substrate, covering the display area and the peripheral area. The organic light emission layer 16 of bottom emission AMOLED has a light emission direction A passing through the array substrate 10 for downward luminescence. The display plane is at the side of the array substrate. In the conventional bottom emission AMOLED, an external light B can pass through the array substrate 10 to the peripheral circuit 14, such that current leakage is produced at the peripheral circuit and affects operation and display quality of the displays.

The cross section of a top emission AMOLED is shown in FIG. 2, and is similar to that of the bottom emission AMOLED. The difference between the top emission and bottom emission AMOLEDs is that light emission direction A of organic light emission layer 16 of the top emission AMOLED is upward passing through the cover glass 18. The display plane of the top emission AMOLED is at the side of the cover glass. Similar to the bottom emission AMOLED shown in FIG. 1, the external light B can pass through the cover glass 18 to the peripheral circuit 14, such that current leakage is produced at the peripheral circuit and affects display quality of the displays.

Currently, one kind of top emission AMOLED is provided to overcome the above problems and the cross section of the display is shown in FIG. 3. The display has a color filter structure. A color filter substrate 19 replaces the cover glass and a black matrix 15 is disposed at the peripheral area 101 of the color filter substrate 19, covering the peripheral circuit 14. The black matrix 15 and red, green and blue color photoresist 17 are disposed on the organic light emission layer 16 at the display area 102 of the color filter substrate 19. Although the peripheral circuit area of FIG. 3 has a black matrix as a light shielding layer, the black matrix is only suitable for the top emission AMOLED as a light shielding layer. Moreover, the AMOLED must have a color filter such that structural design thereof is limited and fabrication cost is increased.

Therefore, an active-matrix organic light emission display that not only overcomes current leakage at the peripheral circuit but also is suitable for both top emission and bottom emission AMOLEDs is desirable. The AMOLED does not need the color filter with black matrix as the light shielding layer, but uses other structural designs to produce light shielding effect at the peripheral circuit area to reduce current leakage and improve display quality.

BRIEF SUMMARY OF THE INVENTION

The invention utilizes a reflective layer at the peripheral circuit area of display as a light shielding layer, which is suitable for both the top emission and bottom emission AMOLEDs and does not need the color filter with black matrix as the light shielding layer. The AMOLED of the invention has less current leakage at the peripheral circuit area such that display quality can be improved. Moreover, fabrication of the reflective layer can be integrated with the active-matrix array process to reduce display fabrication costs.

The invention provides a system for displaying images. An exemplary embodiment of such as system comprises an active-matrix organic light emission display. The active-matrix organic light emission display has a light emission plane and comprises an array substrate having a display area and a peripheral area. An active-matrix array is disposed on the display area of the array substrate. A peripheral circuit is disposed on the peripheral area of the array substrate. A reflective layer is disposed on the peripheral area of the array substrate, between the light emission plane and the peripheral circuit, covering the peripheral circuit. An organic light emission layer is disposed on the active-matrix array and a cover layer is disposed over the organic light emission layer, covering the display area and the peripheral area.

A detailed description is given in the following embodiments with reference to the accompanying drawings.

BRIEF DESCRIPTION OF THE DRAWINGS

The invention can be more fully understood by reading the subsequent detailed description and examples with reference to the accompanying drawings, wherein.

DETAILED DESCRIPTION OF THE INVENTION

The following description is of the best-contemplated mode of carrying out the invention. The description is provided for illustrating the general principles of the invention and is not meant to be limiting. The scope of the invention is best determined by reference to the appended claims.

In order to reduce current leakage at the peripheral circuit area of the display and improve display quality, a reflective layer is disposed between a light emission plane and a peripheral circuit area of an active-matrix organic light emission display. The reflective layer fabrication can be integrated with current active-matrix array processes. The reflective layer can be formed by general array processes without extra processes and materials, such that fabrication cost of the display can be reduced. Moreover, the reflective layer structure can be used in both top emission and bottom emission AMOLEDs.

Figure 1:
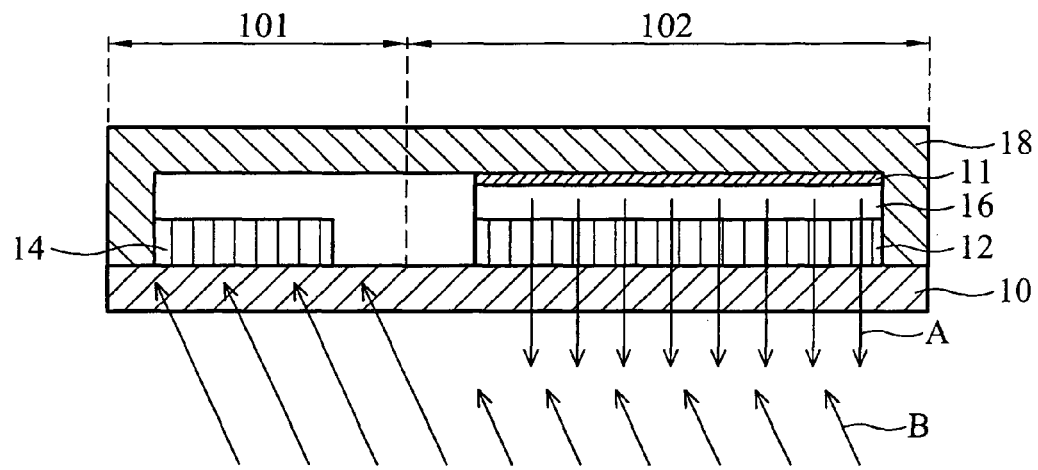
FIG. 1 is a schematic cross section of a conventional bottom emission AMOLED.
Figure 2:
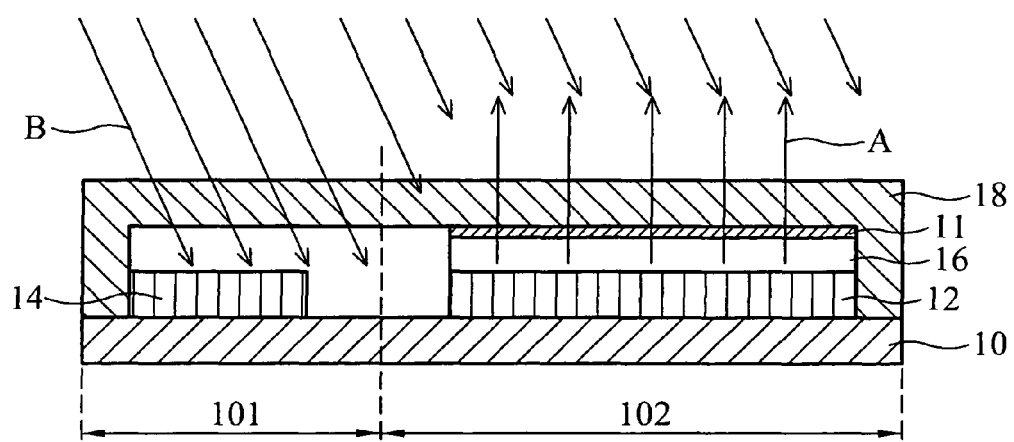
FIG. 2 is a schematic cross section of a conventional top emission AMOLED.
Figure 3:
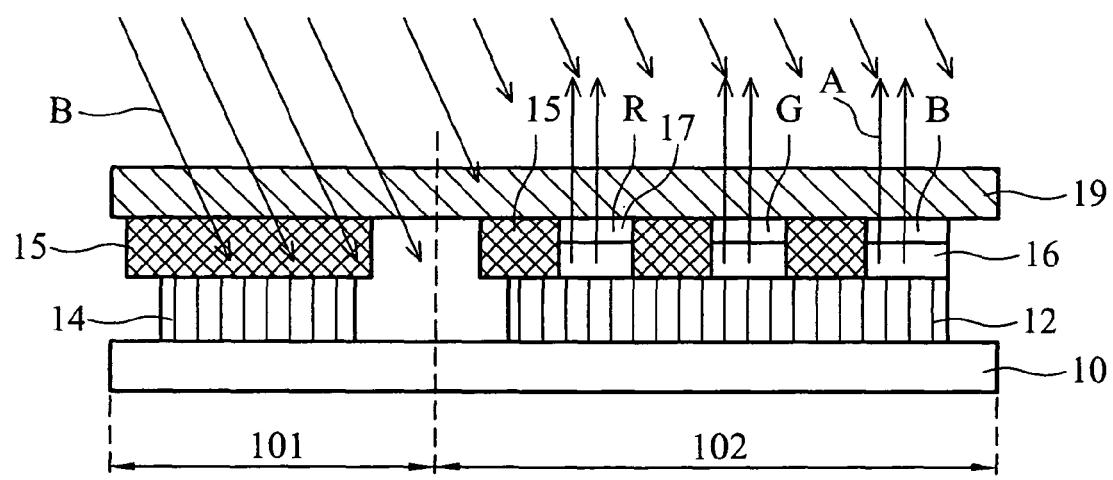
FIG. 3 is a schematic cross section of another conventional top emission AMOLED.
Figure 4:
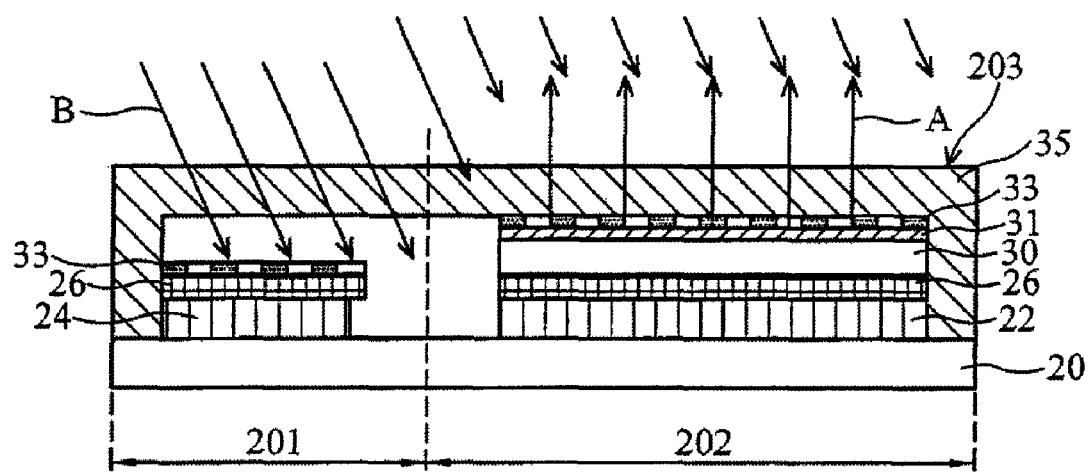
FIG. 4 is a schematic cross section of a top emission AMOLED according to an embodiment of the invention.

Referring to FIG. 4, a cross section of a top emission AMOLED according to an embodiment of the invention is shown, wherein a light emission direction A is upward passing through a cover layer 35. A light emission plane 203 is at the outside of the cover layer 35. An array substrate 20 has a peripheral area 201 and a display area 202. An active-matrix array 22 is formed at the display area 202 and a peripheral circuit 24 is formed at the peripheral area 201 of the array substrate 20 by an array process. There are a plurality of thin-film transistors (TFTs) (not shown) in the active-matrix array 22 and the peripheral circuit 24.

A reflective layer 26 is formed on the peripheral circuit 24 at the peripheral area 201 while the reflective layer, i.e., reflective anode 26, is formed on the active-matrix array 22 at the display area 202 by the array process in the same time, such that process integration is achieved. The reflective layer 26 can be an opaque metal layer and the material thereof is such as molybdenum or aluminum. The reflective layer 26 on the peripheral circuit 24 is disposed between the light emission plane 203 and the peripheral circuit 24, covering the peripheral circuit 24 and has light shielding function. The reflective layer 26 on the peripheral circuit 24 can reflect an external light B illuminating the peripheral area 201, therefore current leakage in the peripheral circuit 24 can be reduced.

Next, an organic light emission layer 30 is formed on the reflective layer 26 of the active-matrix array 22. The organic light emission layer 30 can illuminate red, green and blue (RGB) light side-by-side. The organic light emission layer further comprises a hole transport layer, a light emitting layer and an electron transport layer. In addition, a cathode layer 31 can be disposed on the organic light emission layer 30. The cathode layer 31 may be a transparent or a translucent conductive layer and the material thereof is such as ITO, IZO, ZnO, thin Al—Ag alloy, thin Al layer or thin Ag layer. Moreover, for the electric properties, a patterned bus metal layer 33 can be formed on the cathode layer 31. The patterned bus metal layer 33 may be a strip type metal layer as an auxiliary cathode. The material of the patterned bus metal layer is such as Al or Ag. In addition, the patterned bus metal layer 33 can also be disposed on the reflective layer 26 at the peripheral area (see, FIG. 4).

A cover layer 35 is formed over the all array substrate, covering the peripheral area 201 and the display area 202 to protect the AMOLED from moisture and oxygen in the environment. The cover layer 35 may be a glass substrate or a protective layer, wherein the protective layer is formed by alternately stacking a plurality of organic and inorganic layers to replace the glass substrate.

Figure 5A:
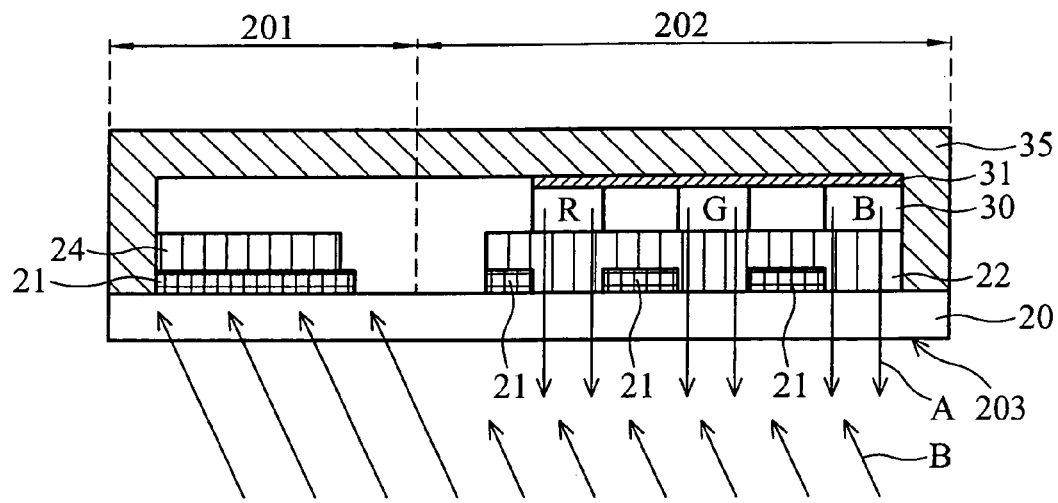
FIG. 5A is a schematic cross section of a bottom emission AMOLED according to an embodiment of the invention.

Referring to FIG. 5A, a cross section of a bottom emission AMOLED is shown according to an embodiment of the invention, wherein a light emission direction A is downward, passing through an array substrate 20. A light emission plane 203 is at the outside of the array substrate 20. The array substrate 20 has a peripheral area 201 and a display area 202. Before an active-matrix array 22 is formed, a reflective layer 21 is formed at the peripheral area 201 and the display area 202 of the array substrate 20 at the same time. The reflective layer 21 at the display area 202 is a patterned reflective layer surrounding the periphery of each pixel of the display. From the top view, the shape of the patterned reflective layer is a grid. Then, the active-matrix array 22 is formed on the reflective layer 21 at the display area 202 of the array substrate. The peripheral circuit 24 is formed on the reflective layer 21 at the peripheral area 201 of the array substrate. The reflective layer 21 can be an opaque metal layer and the material thereof may be the metal with a reflectivity greater than 90%, such as Mo. In addition, because the subsequent active-matrix array 22 and the peripheral circuit 24 may be formed by low temperature polysilicon (LTPS) process, the reflective layer 21 must succumb to high temperature during the LTPS process step. The LTPS process step may be excimer laser anneal (ELA), rapid thermal anneal (RTA), hydrogenation or de-hydrogenation. The melting point of the reflective layer must be greater than 400° C.

There are a plurality of thin-film transistors (TFTs) (not shown) in the active-matrix array 22 and the peripheral circuit 24. When the peripheral circuit 24 is illuminated by the external light B, current leakage is produced in the interfaces of the TFT channel area. Therefore, a light shielding layer must be disposed under the TFT channel area. In this embodiment, the reflective layer 21 at the peripheral area 201 of the array substrate 20 is disposed between the light emission plane 203 and the peripheral circuit 24, covering the peripheral circuit 24. Because the reflective layer 21 has a light shielding function which can reflect the external light B illuminating to the peripheral area 201, the current leakage in the peripheral circuit 24 can be reduced.

Then, an organic light emission layer 30 is formed on the active-matrix array 22. The organic light emission layer 30 can illuminate red, green and blue (RGB) light side-by-side. The material and process of the organic light emission layer 30 can be the same as the above embodiments. In addition, a cathode layer 31 can be disposed on the organic light emission layer 30. The cathode layer 31 may be a transparent or a translucent conductive layer and the material thereof is such as ITO, IZO, ZnO, thin Al—Ag alloy, thin Al layer or thin Ag layer. A cover layer 35 is formed over the entire array substrate, covering the peripheral area 201 and the display area 202 to protect the AMOLED from moisture and oxygen in the environment. The cover layer 35 may be a glass substrate or a protective layer.

Figure 5B:
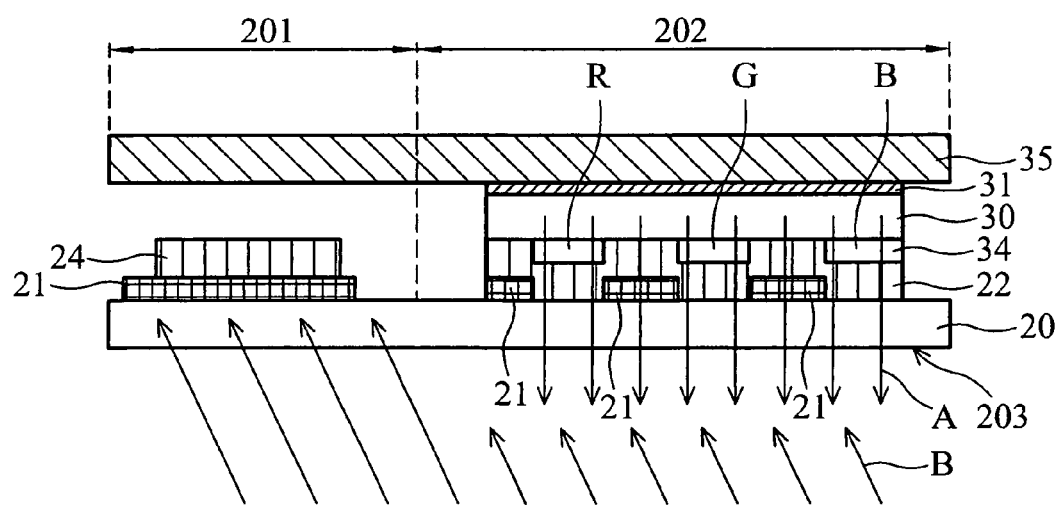
FIG. 5B is a schematic cross section of a bottom emission AMOLED according to another embodiment of the invention.

Referring to FIG. 5B, a cross section of a bottom emission AMOLED according to another embodiment of the invention is shown. The difference between FIGS. 5A and 5B is that the AMOLED of FIG. 5B has a color filter on array (COA) structure 34. An organic light emission layer 30 is disposed on the active-matrix array 22 and red, green and blue (RGB) color photoresist of the COA 34. There is no black matrix at the display area 202 of the display. In this embodiment, the organic light emission layer can emit white light. The reflective layer 21 at the peripheral area 201 can reflect the external light B illuminating to the peripheral area, such that current leakage in the peripheral circuit 24 can be reduced. In addition, the cover layer 35 of this embodiment may be a glass substrate or a protective layer.

Compared with conventional AMOLEDs, the AMOLED of the invention has a reflective layer disposed between the peripheral circuit and the light emission plane to avoid the external light illuminating to the peripheral circuit. Therefore, current leakage in the peripheral circuit 24 can be reduced. Moreover, the light shielding structure at the peripheral circuit area of the invention does not require a color filter with black matrix. The light shielding structure can be formed by current array process to deposit a reflective layer on the array substrate to achieve light shielding effect. Therefore, the fabrication of the reflective layer can be integrated with the array process to reduce fabrication costs. The reflective layer of the invention can be used for both the top emission and bottom emission AMOLEDs. Alternatively, the conventional AMOLED must use color filter with black matrix as a light shielding layer which is only suitable for the top emission AMOLED. Because color filter in the bottom emission AMOLED is a COA structure, the black matrix at the peripheral area is disposed over the peripheral circuit and the light emission plane. The light shielding layer at the peripheral circuit area must be disposed between the light emission plane and the peripheral circuit to achieve light shielding effect. Therefore, the black matrix at the peripheral area of the bottom emission AMOLED can not achieve light shielding effect.

Figure 6:
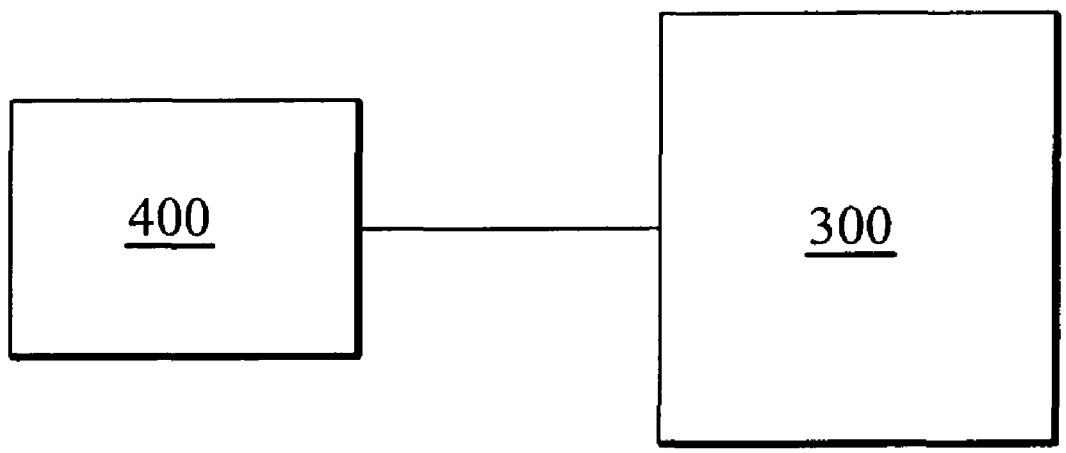
FIG. 6 schematically shows a system for displaying images including the AMOLED according to an embodiment of the invention.

Referring to FIG. 6, system 500 for displaying images including the AMOLED according to an embodiment of the invention is shown. The system comprises an AMOLED 300. The AMOLED 300 can be a part of an electronic device. In general, the system 500 for displaying images comprises the AMOLED 300 and an input unit 400. The input unit 400 is coupled to the AMOLED 300 and operative to provide input to the AMOLED such that the AMOLED displays images. The system 500 for displaying images can be a mobile phone, digital camera, personal data assistant (PDA), notebook computer, desktop computer, television, car display or portable DVD player.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system for displaying images, comprising:
an active-matrix organic light emission display, having a light emission plane, wherein the active-matrix organic light emission display comprises:
an array substrate, having a display area and a peripheral area;
an active-matrix array disposed on the display area of the array substrate;
a peripheral circuit disposed on the peripheral area of the array substrate;
a reflective layer disposed on the peripheral area and the display area of the array substrate, between the light emission plane and the peripheral circuit and covering the peripheral circuit to prevent any light from reaching the peripheral circuit;
an organic light emission layer disposed over the active-matrix array; and
a cover layer disposed over the organic light emission layer, covering the display area and the peripheral area
wherein the reflective layer at the display area is directly disposed under the organic light emission layer, forming an anode layer of the active-matrix organic light emission display.

2. The system as claimed in claim 1, wherein no black matrix layer is disposed on the peripheral area and the display area.

3. The system as claimed in claim 1, wherein the cover layer comprises a glass substrate or a protective layer.

4. The system as claimed in claim 3, wherein the protective layer comprises a plurality of organic and inorganic layers.

5. The system as claimed in claim 2, wherein the active-matrix organic light emission display is a top emission active-matrix organic light emission display, having a light emission direction passing through the cover layer, the light emission plane is at the cover layer, and the reflective layer is disposed on the active-matrix array at the display area and on the peripheral circuit at the peripheral area.

6. The system as claimed in claim 5, wherein the reflective layer comprises an opaque metal layer.

7. The system as claimed in claim 5, further comprising a cathode layer disposed on the organic light emission layer.

8. The system as claimed in claim 7, further comprising a patterned bus metal layer disposed on the cathode layer.

9. The system as claimed in claim 8, wherein the patterned bus metal layer is opaque.

10. The system as claimed in claim 8, wherein the patterned bus metal layer is further disposed on the reflective layer at the peripheral area.

11. The system as claimed in claim 5, wherein the organic light emission layer emits red, green and blue (RGB) light side-by-side and no color filter is disposed between the cover layer and the organic light emission layer.

12. A system for displaying images, comprising:
an active-matrix organic light emission display, having a light emission plane, wherein
the active-matrix organic light emission display comprises:
an array substrate, having a display area and a peripheral area;
an active-matrix array disposed on the display area of the array substrate;
a peripheral circuit disposed on the peripheral area of the array substrate;
a reflective layer disposed on the peripheral area and the display area of the array substrate, between the light emission plane and the peripheral circuit and covering the peripheral circuit;
an organic light emission layer disposed over the active-matrix array; and
a cover layer disposed over the organic light emission layer, covering the display area and the peripheral area,
wherein no black matrix layer is disposed on the peripheral area and the display area, and
wherein the active-matrix organic light emission display is a bottom emission active-matrix organic light emission display, having a light emission direction passing through the array substrate, the light emission plane is at the array substrate, and the reflective layer is disposed between the array substrate and the peripheral circuit and between the array substrate and the active-matrix array, and wherein the reflective layer between the array substrate and the active-matrix array is a patterned reflective layer and the patterned reflective layer surrounds the periphery of each pixel of the active-matrix organic light emission display.

13. The system as claimed in claim 12, wherein the reflective layer has a reflectivity greater than 90%.

14. The system as claimed in claim 12, wherein the reflective layer has a melting point greater than 400° C.

15. The system as claimed in claim 12, wherein the organic light emission layer emits white light, the active-matrix organic light emission display further comprises a color filter disposed on the active-matrix array (COA), and the organic light emission layer is disposed on the active-matrix array and the color filter.

16. The system as claimed in claim 12, wherein the organic light emission layer emits red, green and blue (RGB) light side-by-side, disposed on the active-matrix array, and no color filter is disposed between the active-matrix array and the organic light emission layer.

17. The system as claimed in claim 1, further comprising an electronic device, wherein the electronic device comprises:
 the active-matrix organic light emission display; and
 an input unit coupled to the active-matrix organic light emission display to provide input to the active-matrix organic light emission display such that the active-matrix organic light emission display displays images.

18. The system as claimed in claim 17, wherein the electronic device is a mobile phone, digital camera, personal data assistant (PDA), notebook computer, desktop computer, television, car display or portable DVD player.

19. The system as claimed in claim 1, wherein the reflective layer is disposed on the peripheral circuit covering the peripheral circuit, and on the active-matrix array of the array substrate, between the active-matrix array and the organic light emission layer.

20. The system as in claim 12, wherein the reflective layer, disposed on the peripheral area and the display area, is formed from the same layer on the same side of the array substrate.

\* \* \* \* \*